United States Patent
Konishi et al.

[11] Patent Number: 5,891,531
[45] Date of Patent: Apr. 6, 1999

[54] PROCESS FOR PRODUCING A THIN FILM OF A FLOURIDE

[75] Inventors: Akio Konishi, Kakogawa; Ryohei Terai, Ibaraki; Yoji Kawamoto, Kobe, all of Japan

[73] Assignee: Yamamura Glass Co., Ltd., Hyogo, Japan

[21] Appl. No.: 878,115

[22] Filed: Jun. 18, 1997

[30] Foreign Application Priority Data

Jun. 21, 1996 [JP] Japan .................................. 8-181364

[51] Int. Cl.$^6$ .................................................. B05D 3/06
[52] U.S. Cl. ...................... 427/564; 427/575; 427/576; 65/388
[58] Field of Search .................. 427/564, 575, 427/576, 490; 65/388

[56] References Cited

U.S. PATENT DOCUMENTS

| | | | |
|---|---|---|---|
| 4,378,987 | 4/1983 | Miller et al. | 65/3.12 |
| 4,610,708 | 9/1986 | Sarhangi et al. | 65/3.12 |
| 4,718,929 | 1/1988 | Power et al. | 65/3.12 |
| 4,801,468 | 1/1989 | Ishihara et al. | 427/564 |

FOREIGN PATENT DOCUMENTS

| | | |
|---|---|---|
| 0 331 483 | 9/1989 | European Pat. Off. |
| 62-032087 | 2/1987 | Japan . |
| 62-099456 | 5/1987 | Japan . |
| 62-145727 | 6/1987 | Japan . |
| 3-193876 | 8/1991 | Japan . |
| 5-024875 | 2/1993 | Japan . |
| 5-043256 | 2/1993 | Japan . |
| 5-192565 | 8/1993 | Japan . |
| 5-194093 | 8/1993 | Japan . |
| 6-092676 | 4/1994 | Japan . |
| 7-252646 | 10/1995 | Japan . |

Primary Examiner—Kathryn L. Gorgos
Assistant Examiner—Kishor Mayekar
Attorney, Agent, or Firm—Young & Thompson

[57] ABSTRACT

A process for producing a thin film of a fluoride comprising reacting a gaseous fluorinating agent and gas of a volatile organometallic compound in a gas phase in a reactor, wherein a plasma of the gaseous fluorinating agent obtained by activating the gaseous fluorinating agent by microwave under a condition of electron cyclotron resonance is used as a fluorine source, and the fluoride is deposited on a substrate by reacting the plasma of the gaseous fluorinating agent with the gas of a volatile organometallic compound at outside of an area of generation of the plasma. A thin film of a fluoride which contains very little impurities such as carbon, oxygen, and organic substances, and is highly pure, transparent, and consolidated is produced.

7 Claims, 5 Drawing Sheets

PROCESS FOR PRODUCING A THIN FILM OF A FLOURIDE

FIELD OF THE INVENTION

The present invention relates to a process for producing a thin film of a fluoride. More particularly, the present invention relates to a process for producing a thin film of a fluoride which can be used for planer passive waveguide optics, such as optical waveguide directional couplers, optical waveguide splitters, and optical waveguide branches, planer active waveguide optics, such as optical waveguide amplifiers and lasers, optical waveguide circuits formed by integration of these optics, display devices utilizing the up-conversion fluorescence and the electroluminescence, recording devices utilizing the photochemical hole burning phenomenon and local change in the refractive index, and insulation films used for semiconductor devices.

PRIOR ART OF THE INVENTION

Heretofore, production of a thin film of a fluoride has been attempted by the vapor deposition, the radio frequency sputtering, and CVD.

As for the vapor deposition, a process in which a mixture of fluorides having a fluoride glass composition corresponding to a composition deposited from the vapor is mixed into a specific mixture of fluorides and vaporized by heating and melting under a high vacuum, and a thin film of the fluoride glass is vapor deposited on a substrate is disclosed in Japanese Patent Application (as a national phase under PCT) Laid-Open No. Heisei 4(1992)-503053. However, the composition of the glass which can be deposited by this process is limited to compositions obtained by combinations of metal fluorides having a high vapor pressure, such as $PbF_2$, $ZnF_2$, and $GaF_3$. Barium fluoride and other fluorides of alkaline earth metals which are most popular components of fluoride glasses and fluorides of rare earth metals having optical functions have very low vapor pressures. Therefore, producing fluoride glasses containing barium, other alkaline earth metals, or rare earth metals as the components by this process is difficult. This fact was reported by B. Boulard et al. in SPIE, Volume 1513, Page 204 (1991).

A process in which metal fluorides which are components of a fluoride glass is vaporized by heating under a high vacuum by using electron beams, and the fluoride glass is deposited on a molded article of a fluoride glass to produce a preform for optical fibers is disclosed in Japanese Patent Application Laid-Open No. Showa 64(1989)-52630. In this process, difference in the vapor pressures of various metal fluorides does not cause a problem, and this process can be applied to the production of thin films of fluoride glasses having various compositions. However, the thin films produced by the vapor deposition has a problem that adhesion is weak.

As for the radio frequency sputtering, a process in which a fluoride glass is deposited on a molded article of a fluoride glass by using the radio frequency sputtering to produce a preform for optical fibers is disclosed in Japanese Patent Application Laid-Open No. Showa 64(1989)-52630. This process can also be applied to producing a thin film. However, the radio frequency sputtering has a problem that the deposition rate is small.

Many studies have been made on CVD because of the characteristics that a uniform thin film of a large area can be obtained, that the deposition rate is large, and that the control of the composition is easy. As an example of production of a halide glass by CVD, a process in which vapor of a volatile organometallic compound and vapor of a halogenating agent are brought into reaction with each other in a heated area to deposit a powdery suspension of a particulate material which is often referred as "soot" on a substrate, and the formed powdery suspension is fused to form a continuous glass, which is then drawn to prepare optical fibers is disclosed in Japanese Patent Application Laid-Open No. Showa 58(1983)-125631. A process in which a vaporized metal source, such as organometallic compounds having alkyl substituents and metal β-diketonates, and a vaporized halogen source are brought into reaction with each other in a heated area to synthesize a powdery suspension of a particulate material of a metal halide, which is then heated and consolidated to form a layer of glass, and a transparent preform or fiber is produced is disclosed in the U.S. Pat. No. 4,378,987. This process can be applied to the production of a thin film of a fluoride glass. However, when the powdery suspension of a particulate material is heated for melting, and corrosion of a substrate takes place because of the very low viscosity of the melt of the fluoride glass, the glass itself is contaminated with the components of the substrate. Therefore, obtaining a glass suitable for light propagation is difficult. Moreover, when the heating temperature is decreased, and a continuous glass is formed by softening of a powdery suspension of a particulate material, producing a transparent glass is difficult because pores are remained, as reported by K. Fujiura et al. in Jpn. J. Appl. Phys. Volume 28, Page L2236 (1989).

A process in which vapor of a volatile organometallic compound, such as a halogenated metal β-diketonate, which is used as both of the metal source and the halogen source is decomposed in a heated area or in an area of generation of plasma and a product of a metal halide is prepared is disclosed in Japanese Patent Application Laid-Open No. Heisei 1(1989)-167204. Because this reaction is a decomposition reaction, organic substituents in the molecules of the organometallic compound are carbonized, and the product of a metal halide is contaminated with carbon. For preventing contamination of the product with carbon, using $O_2$, $F_2$, or $CF_4$ as the carbon getter is proposed. However, it is not easy to prevent incorporation of active substances containing carbon and active substances containing oxygen which are formed by decomposition into a fluoride crystal or a fluoride glass during the formation of the fluoride crystal or the fluoride glass by deposition.

It is generally known that there are many compositions of fluoride glass which contain alkaline earth metal, particularly barium, as the component, and these compositions present most stable systems. A process in which a gas of a specific volatile barium β-diketonate, other gases of the metal source, and a gaseous fluorinating agent are brought into reaction accompanied with decomposition in a heated area in the gas phase under an ordinary pressure or a low pressure of about 10 Torr to deposit fine particles of a metal fluoride on a substrate, and the obtained product was lead to the tube collapse by heating to produce a preform of a fluoride glass containing barium for optical fibers is disclosed in Japanese Patent Application Laid-Open No. Heisei 2(1990)-275726. However, it is necessary in this process that the glass is heated to a temperature lower than the glass transition temperature under a stream of a gas containing a halogen for removing impurities containing oxygen, such as hydroxyl group, before the tube collapse by heating. Moreover, when the supply of a gaseous fluorinating agent is small, a problem arises in that carbon formed by decomposition of the starting material contaminate the product as an impurity, and coloring of the glass is caused. When the supply of a gaseous fluorinating agent is large, a problem arises in that elements other than fluorine in the gaseous fluorinating agent contaminate the glass to cause loss in the optical properties, and difficulty tends to arise with respect to the optical properties.

A process for producing a thin film of a barium compound is disclosed in Japanese Patent Application Laid-Open No. Heisei 4(1992)-260640. However, this process has the problem with respect to the optical properties, similarly to the above process. Moreover, the specific volatile barium β-diketonate used in this process is decomposed and degraded by heating to cause problems that the volatility is decreased. Thus, this process has problems on the volatility as well as the heat stability, and the reproducibility in the production of the thin film.

A process in which contamination of the product with carbon impurities formed by decomposition of a gas of a volatile organometallic compound in the gas phase synthesis of a fluoride glass is prevented by introducing oxygen into the reaction system, and an optically highly uniform fluoride glass is produced is disclosed in Japanese Patent Application Laid-Open No. Heisei 4(1992)-305025. However, introduction of oxygen has a drawback in that oxygen reacts with the gas of a volatile organometallic compound to form non-volatile decomposition products.

A process in which contamination of the product with carbon impurities formed by decomposition of a gas of a volatile organometallic compound in the gas phase synthesis of a fluoride glass is prevented by using a gas containing oxygen, such as $N_2O$, an optically highly uniform fluoride glass is produced, and moreover the formation of non-volatile decomposition products is prevented is disclosed in Japanese Patent Application Laid-Open No. Heisei 4(1992)-331723. However, because oxygen is taken into the fluoride glass, the low phonon energy characteristic which is the advantage of the fluoride glass is diminished, and the advantage of the fluoride glass as the host glass for optically functional rare earth elements is lost. As described above, preventing the contamination of oxygen into a glass is not easy.

When the heat energy is used as the energy source of the fluorination reaction, it is impossible that the reaction at a high temperature which enables supplying a large heat energy is conducted because the crystallization temperature of a fluoride glass is low. This causes the problem that the fluorination reaction does not proceed sufficiently and impurities such as organic substances are left remaining in the fluoride glass. However, the synthesis at a low temperature is possible when plasma is used as the energy source of the reaction.

A process in which a gaseous fluorinating agent is activated, and the activated gaseous fluorinating agent and a gas of a volatile organometallic compound are brought into reaction with each other to produce a preform for a fluoride optical fiber is disclosed in Japanese Patent Application Laid-Open No. Heisei 5(1993)-24875. A fluoride glass containing little residual impurities such as organic substances is produced by forming a strongly oxidizing fluorine radical under a vacuum of 1 Torr, followed by reacting the formed radical with the gas of a volatile organometallic compound. However, an absorption assigned to an organic group is found at about 1300 $cm^-$ in the infrared spectrum.

As described above, although CVD process has advantages that a uniform thin film of a large area can be obtained, that the deposition rate is large, and that controlling the composition is easily, no technology for producing a highly pure, transparent, and consolidated thin film which do not contain impurities, such as carbon, oxygen, and organic substances, has been established.

As for the barium source, processes in which stable supply of a gas of a volatile organobarium compound which is used for gas phase synthesis of a thin film of a fluoride glass containing barium or a thin film of barium fluoride is enabled by using a specific barium β-diketonate, i.e., bis(1, 1,1,2,2-pentafluoro-6,6-dimethyl-3,5-heptanedionato) barium, and the uniformity of a thin film of fluoride glass containing barium or a thin film of barium fluoride and the reproducibility of synthesis of the thin films are improved are disclosed in Japanese Patent Application Laid-Open No. Heisei 5(1993)-43256 and Japanese Patent Application Laid-Open No. Heisei 5(1993)-194093. A process in which a specific volatile organobarium compound, i.e., a volatile organobarium compound represented by the structure of $BaR_2$ in which an alkenyl group, a benzyl group, a benzyl group substituted with fluorine, or a substituted cyclopentadienyl group is bonded with barium or an adduct in which a compound containing oxygen or a compound containing nitrogen is additionally coordinated to this compound, is used is disclosed in Japanese Patent Application Laid-Open No. Heisei 5(1993)-17142. A process in which a high quality thin film of barium compound is formed by using a specific volatile organobarium compound, i.e., barium monothio-β-diketonate, is disclosed in Japanese Patent Application Laid-Open No. Heisei 5(1993)-208818. However, barium ion has a large ionic radius and the valency of 2. Therefore, an organic molecule or an organic group, such as a β-diketone, an alkyl group, an alkenyl group, a benzyl group, a benzyl group substituted with fluorine, and a substituted cyclopentadienyl group, can form only two covalent bonds or ionic bonds per one barium ion. Because of this restriction, the steric shield of barium ion with an organic molecule or an organic group is insufficient to cause strong interaction between molecules of the volatile organobarium compound. This causes thermal decomposition and polymerization during heating, and the volatility is decreased during the heating. Thus, it is difficult to produce a thin film with excellent reproducibility.

A process in which an organic molecule having one or two oxygen atoms or nitrogen atoms which can coordinate with one barium ion is additionally coordinated to barium ion to enhance the steric shield of the barium ion, and thus the thermal stability of a volatile organobarium compound is improved to produce a thin film containing barium with a good reproducibility is proposed in Japanese Patent Application Laid-Open No. Heisei 5(1993)-17142. However, when the number of oxygen atom or nitrogen atom which can coordinate to one barium ion is one or two, the bonding strength of the organic molecule to barium is weak and the bond is easily broken by heating.

Processes in which liquid or vapor of an organic molecule having one or two oxygen atoms, such as tetrahydrofuran and dipivaloylmethane, is brought into contact with a volatile organometallic compound to achieve stable supply of a gas of the volatile organometallic compound, and a highly uniform fluoride glass containing barium is synthesized are disclosed in Japanese Patent Application Laid-Open No. Heisei 5(1993)-294636 and Japanese Patent Application Laid-Open No. Heisei 5(1993)-294637. However, a problem arises in that the thin film containing barium is contaminated with carbon because a large amount of vapor of the organic molecule is carried into the reaction area together with the gas of the volatile organometallic compound.

As described above, no process for producing a thin film of a fluoride containing barium by using a volatile organobarium compound which is vaporized at a low temperature, shows excellent stability under heating, i.e., is not easily polymerized, and enables formation of a highly pure thin film containing barium with excellent reproducibility has been developed.

SUMMARY OF THE INVENTION

Accordingly, the present invention has an object of providing a process for producing a thin film of a fluoride which contains very little impurities such as carbon, oxygen, and organic substances, and is highly pure, transparent and consolidated.

As the result of the extensive studies by the present inventors to overcome the above problems, it was discovered that a highly pure thin film of a fluoride can be produced by reacting a plasma containing fluorine obtained by activating the gaseous fluorinating agent by microwave under a condition of electron cyclotron resonance with a gas of a volatile organometallic compound at the outside of the area of generation of the plasma, and the present invention has been completed on the basis of the discovery.

Accordingly, the present invention provides:
(1) A process for producing a thin film of a fluoride comprising reacting a gaseous fluorinating agent and gas of a volatile organometallic compound in a gas phase in a reactor, wherein a plasma of the gaseous fluorinating agent obtained by activating the gaseous fluorinating agent by microwave under a condition of electron cyclotron resonance is used as a fluorine source, and the fluoride is deposited on a substrate by reacting the plasma of the gaseous fluorinating agent with the gas of a volatile organometallic compound at outside of an area of generation of the plasma;
(2) A process described in (1), wherein pressure in the reactor is $10^{-2}$ Torr or lower;
(3) A process described in any of (1) and (2), wherein a volatile organobarium compound in which at least one organic molecule having 3 to 12 heteroatoms which can coordinate to one barium ion is coordinated is used as at least one of the volatile organometallic compounds so that a composition of the thin film of a fluoride comprises barium;
(4) A process described in (3), wherein temperature of the substrate is kept higher than or equal to a boiling point of the organic molecule coordinated to barium ion, and the fluoride is deposited on the substrate;
(5) A process described in any of (3) and (4), wherein the heteroatom is at least one atom selected from the group consisting of oxygen, nitrogen, and sulfur;
(6) A process described in any of (1) to (5), wherein temperature of the substrate is kept lower than crystallization temperature of a fluoride glass which is produced, and the fluoride glass is deposited on the substrate; and
(7) A process described in any of (1) to (6), wherein a composition distribution is formed in a direction of thickness in the thin film of a fluoride by separately adjusting flow rates of gases of a plurality of volatile organometallic compounds.

Figure 1:
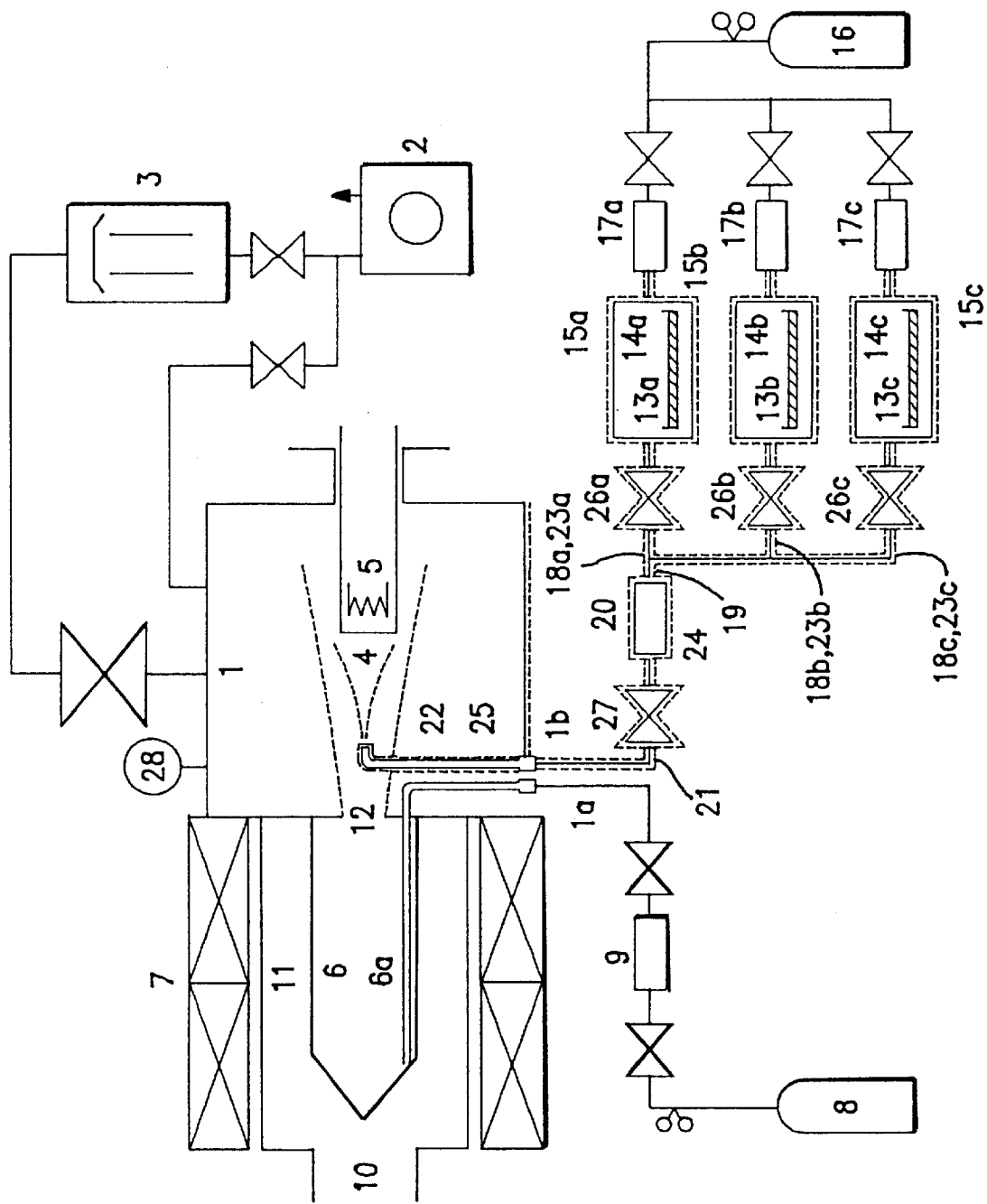
FIG. 1 shows a diagram describing an embodiment of an apparatus for conducting the present invention.

The numbers in the figures have the meanings as listed in the following:

1: a reactor
1a: an inlet
1b: an inlet
2: a rotary pump
3: a diffusion pump
4: a substrate
5: a heater
6: a quartz tube
6a: a nozzle
7: a coil
8: a bomb of a gaseous fluorinating agent
9: a gas flow controller
10: a waveguide
11: a microwave cavity resonator
12: an opening
13a~13c: volatile organometallic compounds
14a~14c: carburetors
15a~15c: heaters
16: a bomb of an inert gas
17a~17c: gas flow controllers
18a~18c: delivery lines for gases of volatile organometallic compounds
19: a delivery line for a gas of a volatile organometallic compound
20: a mixing vessel
21: a delivery line for a gas of a volatile organometallic compound
22: a nozzle
23a~23c: heaters for preventing cooling
24: a heater for preventing cooling
25: a heater for preventing cooling
26a~26c: valves
27: a valve
28: a vacuum gauge

DETAILED DESCRIPTION OF THE INVENTION

The gaseous fluorinating agent which is used in the present invention is not particularly limited as long as the gas is a vaporizable compound containing fluorine atom. Examples of the gaseous fluorinating agent include nitrogen trifluoride $NF_3$, sulfur hexafluoride $SF_6$, and carbon teterafluoride $CF_4$. Among these compounds, nitrogen trifluoride $NF_3$ is particularly preferably used because contamination with impurities can be decreased.

Examples of the volatile organometallic compound used in the present invention include volatile alkyl compounds of metals, such as aluminum, gallium, indium, lead, zinc, cadmium, transition metals, lithium, and magnesium; volatile phenyl compounds of metals, such as bismuth; volatile cyclopentadienyl compounds of metals, such as magnesium, yttrium, rare earth elements, and transition metals; volatile β-diketonates of metals, such as zirconium, hafnium, yttrium, rare earth elements, alkaline earth metals, alkali metals, transition metals, zinc, aluminum, gallium, indium, lead, and bismuth; and volatile alkoxides of metals, such as zirconium, hafnium, aluminum, gallium, bismuth, and lithium. A single type or a combination of two or more types of these volatile organometallic compounds can be used. A volatile inorganic compound, such as gallium chloride and aluminum bromide, may additionally be used in the form contained in the material of the volatile organometallic compound.

FIG. 1 shows a diagram describing an embodiment of an apparatus for conducting the present invention. A reactor 1 is a chamber made of stainless steel in which the pressure can be adjusted to a high vacuum by an evacuation system consisting of a rotary pump 2 and a diffusion pump 3. The inside of the reactor is generally kept at a pressure of $10^{-2}$ Torr or less and monitored by a vacuum gauge 28. A substrate 4 is placed in this reactor and heated by a heater 5.

A quartz tube 6 sealed at one of the ends is attached to the reactor in such a manner that the open end 12 of the quartz tube is placed to the reactor. A coil 7 is wound around the quartz tube, and a magnetic field satisfying the resonance condition of an electron cyclotron, i.e., a magnetic flux density of 875 gauss, is generated at the inside of the quartz tube by an electric current in the coil. A gaseous fluorinating agent is introduced into the quartz tube from a bomb of a gaseous fluorinating agent 8 through a gas flow controller 9 and through an inlet 1a and a nozzle 6a which are disposed on the reactor. Microwave of 2.45 GHz is introduced into a microwave cavity resonator 11 through a waveguide 10. In accordance with the principle of resonance in electron cyclotron, a plasma of the gaseous fluorinating agent is generated at the inside of the quartz tube and injected toward the heated substrate in the reactor through the open end of the quartz tube.

Volatile organometallic compounds 13a~13c which are the starting materials of metal for producing a thin film of a fluoride are put into carburetors 14a~14c made of stainless steel. To the carburetors, heaters 15a~15c are attached. The volatile organometallic compounds in the carburetors are heated by the heaters, and the vapor pressures are increased. An inert gas used as the carrier gas is introduced from a bomb of an inert gas 16 through gas flow controllers 17a~17c into the carburetors and, in the carburetors, forms respective inert gases containing specified amounts of the volatile organometallic compounds which are the starting materials for producing the thin film of a fluoride. The formed gases pass through the delivery lines for gases of volatile organometallic compounds 18a~18c and 19 and are mixed well in a mixing vessel 20. The mixed gas passes through a delivery line for a gas of a volatile organometallic compound 21, introduced into the reactor through an inlet 1b, and injected towards the heated substrate through a nozzle 22.

The delivery lines for gases of volatile organometallic compounds, the mixing vessel, and the nozzle are attached with heaters for preventing cooling 23a~23c, 24, and 25 and heated to a temperature which is higher than the maximum of the heated temperatures of the volatile organometallic compounds in the carburetors by about 30° C. to prevent condensation of the gas of a volatile organometallic compound. The gas of a volatile organometallic compound reacts with the plasma of the gaseous fluorinating agent in the gas phase or on the substrate, and a thin film of a fluoride is deposited on the heated substrate. For achieving stable vaporization, the pressure at the inside of the carburetors, the pressure at the inside of the delivery lines for gases of volatile organometallic compounds, and the pressure at the inside of the mixing vessel are adjusted by valves 26a~26c and 27.

In the present invention, by activating a gaseous fluorinating agent by microwave under the condition of the electron cyclotron resonance, a plasma of the gaseous fluorinating agent which contains strongly oxidizing fluorine radicals as much as about 10% is generated. The plasma of the gaseous fluorinating agent is injected into the reactor disposed at the outside of the area of generation of the plasma and reacts with the gas of the volatile organometallic compound, and a fluoride is deposited on the heated substrate which is disposed in the reactor, to form a thin film of the fluoride. By reacting the plasma of the gaseous fluorinating agent and the gas of the volatile organometallic compound at the outside of the area of generation of the plasma, decomposition of the gas of the volatile organometallic compound by the impact of high energy electrons present in the area of generation of the plasma can be suppressed. The reaction of the gaseous fluorinating agent with the gas of the volatile organometallic compound proceeds sufficiently also by the action of the strongly oxidizing fluorine radical contained in the plasma of the gaseous fluorinating agent. As the combined results, a highly pure transparent thin film of a fluoride containing very little impurities, such as carbon, oxygen, and organic substances, can be produced. The ions generated in the area of generation of the plasma are accelerated by the force toward the lower magnetic field and clash into the substrate in the reactor with the kinetic energy of about 20 to 30 eV. The thin film of a fluoride formed on the substrate has a consolidated structure of a high density by the force of the clash.

In the present invention, it is preferred that the pressure at the inside of the reactor is $10^{-2}$ Torr or less. By conducting the reaction under a pressure of $10^{-2}$ Torr or less, densities of the gases of the volatile organometallic compounds, gases of organic substances formed as byproducts, the plasma of the gaseous fluorinating agent, and the carrier gas which are present in the vicinity of the depositing film surface can be decreased. As the result, the leaving probability of the gases of the volatile organometallic compounds and the gases of organic substances formed as byproducts from the depositing film surface can be increased, and a highly pure transparent thin film of a fluoride containing very little impurities, such as carbon, oxygen, and organic substances, can be produced.

In the present invention, it is preferred that barium is comprised in the composition of the thin film of the fluoride by using a volatile organobarium compound in which at least one organic molecule having 3 to 12 heteroatoms which can coordinate to one barium ion is coordinated as one of the volatile organometallic compounds. As the volatile organobarium compound, compounds in which two organic molecules or organic groups, such as β-diketones, alkoxides, alkyl groups, alkenyl groups, benzyl groups, benzyl groups substituted with fluorine, cyclopentadienyl groups, and substituted cyclopentadienyl groups, are bonded to one barium ion are generally known. Because barium ion has a large ionic radius, it is difficult that barium ion is completely covered with two organic molecules or organic groups. Barium ion can completely be covered by additional coordination of at least one organic molecule having 3 to 12 heteroatom which can coordinate to one barium ion to the barium ion which is already coordinated with two organic molecules or organic groups, such as those described above. The organic molecule having 3 or more heteroatoms which can coordinate to one barium ion shows a strong bonding force with barium ion, and polymerization is suppressed because elimination of the coordinated organic molecules does not take place much by heating. Thus, the stability under heating is improved, and a thin film of a fluoride containing barium can be produced with excellent reproducibility. An organic molecule having 13 or more heteroatoms which can coordinate to one barium ion generally has a high boiling point to cause decrease in the leaving probability from the depositing film surface, and there is the possibility that the amount of impurities in the thin film of a fluoride is increased.

Examples of the heteroatom which can coordinate to barium ion include oxygen, nitrogen, and sulfur. Examples of the organic molecule having such a heteroatom include polyethers, crown ethers, and polyamines. Examples of the volatile organobarium compound having such coordinated organic molecules include bis(hexafluoroacetylacetonato) barium triglyme adduct [Ba(HFA)$_2$(Triglyme)], bis (hexafluoroacetylacetonato)barium tetraglyme adduct [Ba (HFA)$_2$(Tetraglyme)], bis(dipivaloylmethanato )barium bis (triethylenetetramine) adduct [Ba(DPM)$_2$(Trien)], and bis (dipivaloylmethanato)barium bis(tetraethylenepentamine) adduct [Ba(DMP)$_2$(Tetraen)]. The boiling points of triglyme, tetraglyme, triethylenetetramine, and tetraethylenepentamine which are coordinating organic molecules are 216.0° C., 275.3° C., 266.5° C., and 341.5° C., respectively.

In the present invention, it is preferred that the temperature of the substrate is kept higher than or equal to the boiling point of the organic molecule which is coordinated to the metal ion. The reaction of the gaseous fluorinating agent with the gas of a volatile organometallic compound is conducted under a very low pressure. By adjusting the temperature of the substrate at a temperature higher than or equal to the boiling point of the organic molecule which is coordinated to the metal ion, incorporation of the organic molecule into the thin film of a fluoride is decreased, and a highly pure thin film of a fluoride can be produced.

In the present invention, when the thin film of a fluoride is a film of a fluoride glass, the temperature of the substrate is lower than the crystallization temperature of the fluoride glass. Therefore, it is preferred that the temperature of the substrate is higher than or equal to the boiling point of the organic molecule which is coordinated to the metal ion and lower than the temperature of crystallization of the fluoride glass.

In the present invention, a thin film of a fluoride crystal can be produced by selecting the composition of the volatile organometallic compound so that a fluoride of a high crystallinity is formed or by keeping the temperature of the substrate higher than or equal to the temperature of crystallization of the fluoride glass.

In the present invention, distribution of the composition can be formed in the direction of thickness of the thin film of a fluoride by using a plurality of volatile organometallic compounds and adjusting the flow rate of each gas. For example, when three types of the volatile organometallic compound are used, a thin film of a fluoride which contains two types of metal in the vicinity of the surface of the substrate as well as in the vicinity of the surface of the thin film and three types of metal in the intermediate portion can be produced by supplying gases of two types of the organometallic compound alone in the initial and final steps of the film formation and supplying gases of three types of the organometallic compound in the intermediate step of the film formation. Alternatively, when a plurality of the organometallic compounds are used and the flow rate of one of the gases of volatile organometallic compounds is continuously varied, a thin film of a fluoride in which the concentration of the specific metal is continuously varied in the direction of the thickness of the thin film of a fluoride can be produced.

In the present invention, the material of the substrate is not particularly limited as long as the material is durable at the substrate temperature during deposition. Examples of the material of the substrate include calcium fluoride $CaF_2$, fluoride glasses, oxide glasses, silicon, and magnesium oxide MgO.

By the process of the present invention, a thin film of a fluoride glass, such as $ZrF_4$-$BaF_2$-$LaF_3$-$AlF_3$-NaF fluoride glasses, $InF_3$-$BaF_2$-$YF_3$ fluoride glasses, $InF_3$-$PbF_2$-$ZnF_2$ fluoride glasses, and $AlF_3$-$CdF_2$-$PbF_2$-LiF fluoride glasses, or a thin film of a fluoride crystal, such as $ZnF_2$:Mn, $ZnF_2$:Gd, $LiYF_4$, $CaF_2$, $YF_3$:Tm, $CaF_2$:Eu, and $CdF_2$:In, can be produced, and a highly pure, transparent, and consolidated thin film of a fluoride can be obtained.

To summarize the advantages obtained by the invention, a thin film of a fluoride which contains very little impurities such as carbon, oxygen, and organic substances, and is highly pure, transparent and consolidated is produced easily with excellent reproducibility. Any of a thin film of a fluoride glass and a thin film of a fluoride crystal can be produced by selecting the temperature of the substrate and the composition of the fluoride. A thin film of a fluoride in which the composition is varied stepwise or continuously in the direction of the thickness of the thin film of a fluoride can also be produced. The thin film of a fluoride produced by the process of the present invention is useful as an optically functional material.

EXAMPLES

The present invention is described in more detail with reference to examples in the following. However, the present invention is not limited by the examples.

Example 1

A thin film of a fluoride was prepared by using nitrogen trifluoride $NF_3$ as the gaseous fluorinating agent and tetrakis (hexafluoroacetylacetonato)zirconium $Zr(HFA)_4$, bis (hexafluoroacetylacetonato)barium tetraglyme adduct Ba(HFA)$_2$(Tetraglyme), and tris(dipivaloylmethanato) europium Eu(DPM)$_3$ as the volatile organometallic compounds which were starting materials of metal for producing a thin film of a fluoride. $Zr(HFA)_4$, Ba(HFA)$_2$(Tetraglyme), and Eu(DPM)$_3$ were vaporized by heating to 85° C., 170° C., and 190° C., respectively, and delivered using argon as the carrier. Delivery lines for gases of the volatile organometallic compounds and a mixing vessel were all heated to 220° C. The flow rate of the carrier gas was adjusted to 1.0 sccm (standard cubic centimeter per minute) for $Zr(HFA)_4$, 1.2 sccm for Ba(HFA)$_2$ (Tetraglyme), and 0.3 sccm for Eu(DPM)$_3$. Nitrogen trifluoride $NF_3$ was delivered at the flow rate of 60 sccm, and a plasma of a gaseous fluorinating agent was generated under the electron cyclotron resonance condition of the microwave power of 30 W. The preparation of a thin film was conducted under the pressure of $2 \times 10^{-3}$ Torr, and a colorless transparent thin film of a fluoride showing an excellent mirror surface and having the thickness of 3.6 μm was obtained in 3 hours on a $CaF_2$ substrate of 50 mm×50 mm which was heated to 300° C.

Figure 2:
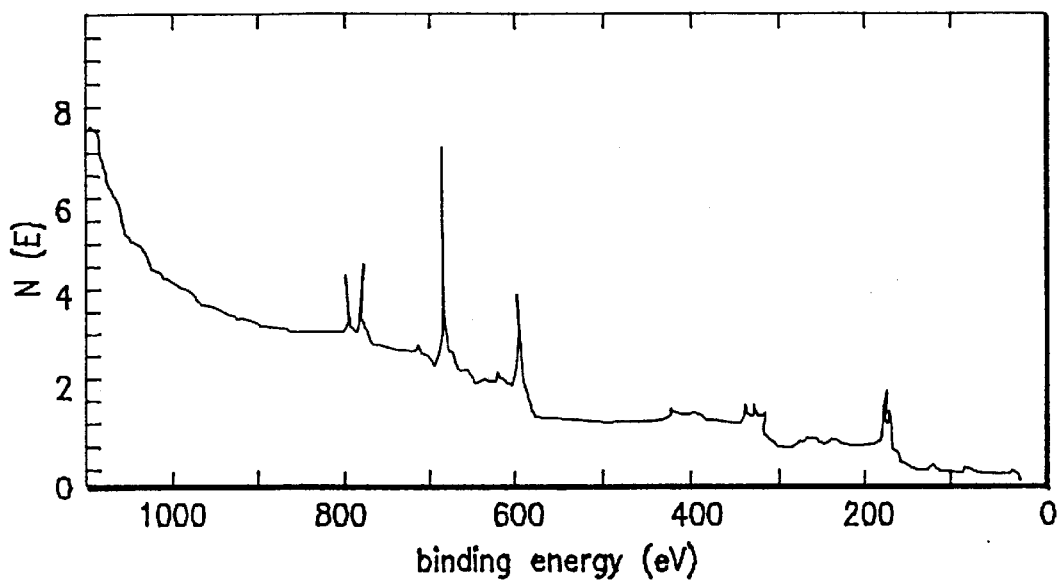
FIG. 2 shows a spectrum of a thin film of a fluoride obtained by the X-ray photoelectron spectroscopy.

FIG. 2 shows the spectrum of the obtained thin film of a fluoride by the X-ray photoelectron spectroscopy (XPS). This figure show that the obtained thin film was a fluoride composed of Zr, Ba, Eu, and F alone and containing no residual carbon or oxygen. The composition of the thin film was calculated by comparing the areas of Zr3d, Ba3d5, and Eu4d in the spectrum with the corresponding areas in the spectrum of a glass having the composition of $60ZrF_4 \cdot 30BaF_2 \cdot 10EuF_3$ (% by mol) which was synthesized by the melt process and measured at the same time as the above. The composition was found to be $72ZrF_4 \cdot 15BaF_2 \cdot 13EuF_3$ (% by mol).

Figure 3:
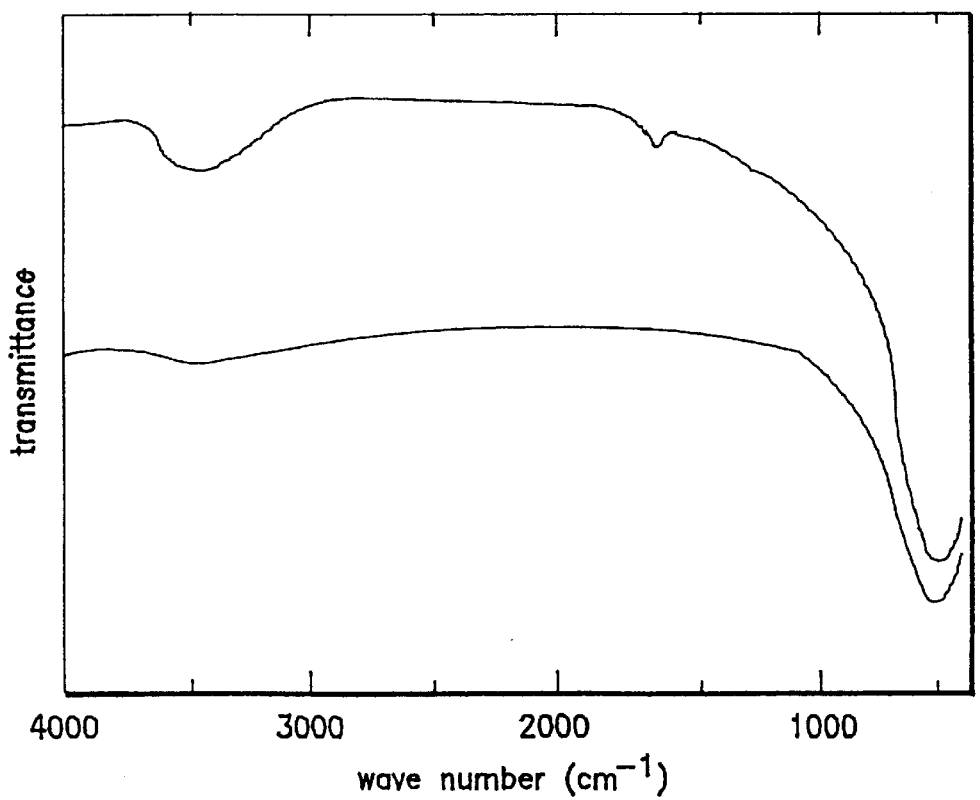
FIG. 3 shows infrared spectra of thin films of a fluoride.

FIG. 3(a) shows the infrared spectrum of the obtained thin film of a fluoride. No absorption was found except for a weak absorption at about 3500 $cm^{-1}$ which was assigned to the stretching vibration of OH and a strong absorption at about 500 $cm^{-1}$ which was assigned to the antisymmetric stretching vibration of $ZrF_n$ polyhedra (n=7 or 8). This shows that the content of organic substances in the obtained thin film of a fluoride was very small.

Figure 4:
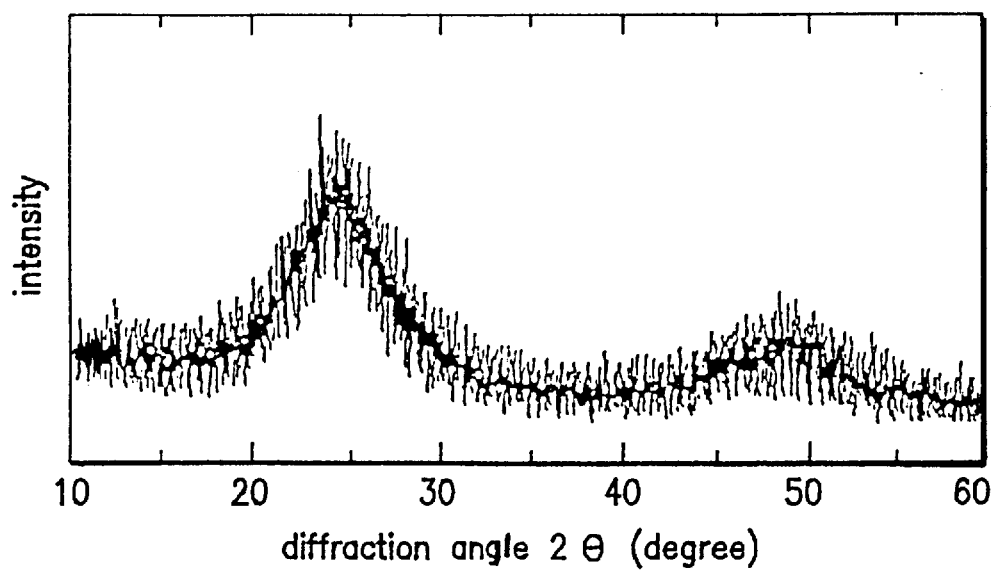
FIG. 4 shows a thin film X-ray diffraction pattern of a thin film of a fluoride obtained by using the CuKα ray.

FIG. 4 shows a thin film X-ray diffraction pattern of the obtained thin film of a fluoride obtained by using the CuKα ray. This X-ray diffraction pattern shows that the thin film of a fluoride is amorphous.

Figure 5:
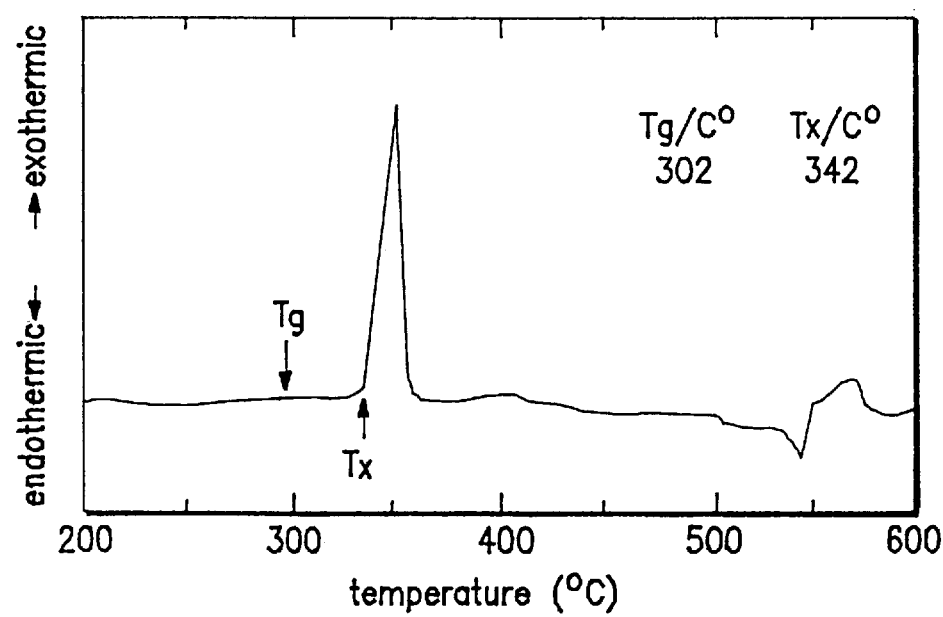
FIG. 5 shows a differential thermal analysis curve of a thin film of a fluoride.

FIG. 5 shows a differential thermal analysis curve of the obtained thin film of a fluoride. Because an endothermic bend which can be assigned to the glass transition was found at 302° C., it can be concluded that this amorphous thin film is a thin film of a fluoride glass.

The density of the obtained thin film of a fluoride glass was found to be 4.8 $g/cm^3$ by calculation from the weight, the thickness, and the area of the thin film. When this value was compared with the density of a fluoride glass which was prepared by the melt process and had the same composition as that of the above thin film, 4.53 $g/cm^3$, it was shown that a more consolidated thin film of a fluoride glass was obtained.

Additionally, the preparation of the above thin film of a fluoride glass was repeatedly conducted 5 times without replacing the 3 types of volatile organometallic compound. The thickness of the obtained thin film of a fluoride glass was the same with all of the obtained films. The thin films of a fluoride glass obtained by the second to sixth preparation had the same properties as those of the thin film of a fluoride obtained by the first preparation.

Example 2

A thin film of a fluoride was prepared in accordance with the same procedures as those conducted in Example 1 except that the pressure at the inside of the reactor was adjusted to $2 \times 10^{-2}$ Torr.

A thin film of a fluoride glass having the thickness of 4.6 μm and an excellent mirror surface was obtained, but the film had a slight color of light brown. FIG. 3(b) shows the infrared spectrum of the obtained thin film of a fluoride glass. When this spectrum is compared with the infrared spectrum of the thin film of a fluoride glass obtained in Example 1, the absorption found at about 3500 $cm^{-1}$ which is assigned to the OH stretching vibration is stronger, and an absorption at 1630 $cm^{-1}$ which is assigned to the stretching vibration of C=O and a weak absorption at 1240 $cm^{-1}$ which is assigned to the stretching vibration of C-F are found. This result shows that the amount of organic substances contained in this thin film of a fluoride glass is larger than the amount of organic substances in the thin film of a fluoride glass obtained in Example 1. The density of the obtained thin film of a fluoride glass was found to be 4.2 $g/cm^3$ by the same calculation as that described in Example 1. These results show that decreasing the pressure at the inside of the reactor is an effective method for increasing the purity and the density of the thin film of a fluoride.

Example 3

A thin film of a fluoride was prepared by using nitrogen trifluoride $NF_3$ as the gaseous fluorinating agent and tris (hexafluoroacetylacetonato)indium $In(HFA)_3$, triethyllead-2,2-dimethylpropoxide $(C_2H_5)_3PbOCH_2C(CH_3)_3$, and bis (dipivaloylmethanato)zinc $Zn(DPM)_2$ as the volatile organometallic compounds which are starting materials of metal for producing a thin film of a fluoride. $In(HFA)_3$, $(C_2H_5)_3PbOCH_2C(CH_3)_3$, and $Zn(DPM)_2$ were vaporized by heating to 100° C., 60° C., and 140° C., respectively, and delivered using argon as the carrier. Delivery lines for gases of the volatile organometallic compounds and a mixing vessel were all heated to 170° C. The flow rate of the carrier gas was adjusted to 1.0 sccm for $In(HFA)_3$, 1.4 sccm for $(C_2H_5)_3PbOCH_2C(CH_3)_3$, and 0.8 sccm for $Zn(DPM)_2$. Nitrogen trifluoride $NF_3$ was delivered at the flow rate of a gas of 60 sccm, and a plasma of a gaseous fluorinating agent was generated under the electron cyclotron resonance condition of the microwave power of 30 W. The preparation of a thin film was conducted under the pressure of $2 \times 10^{-3}$ Torr, and a colorless transparent thin film of a fluoride having the thickness of 4.0 μm and an excellent mirror surface was obtained in 3 hours on a $CaF_2$ substrate heated to 200° C.

The spectrum of the obtained thin film of a fluoride by the X-ray photoelectron spectroscopy (XPS) showed that the obtained thin film was a fluoride composed of In, Pb, Zn, and F alone and containing no residual carbon or oxygen. The thin film X-ray diffraction pattern and the differential thermal analysis curve of the obtained thin film of a fluoride showed that the thin film was a thin film of a fluoride glass.

Example 4

A thin film of a fluoride was prepared in the total time of 4.5 hours in accordance with the same procedures as those conducted in Example 1 except that, among the valves after the carburetor, the valves for $Zr(HFA)_4$ and $Ba(HFA)_2$ (Tetraglyme) after the carburetor were always left open, and the valve for $Eu(DPM)_3$ after the carburetor alone was closed for the initial 1.5 hours, opened for 1.5 hours subsequently, and closed again for the last 1.5 hours.

Figure 6:
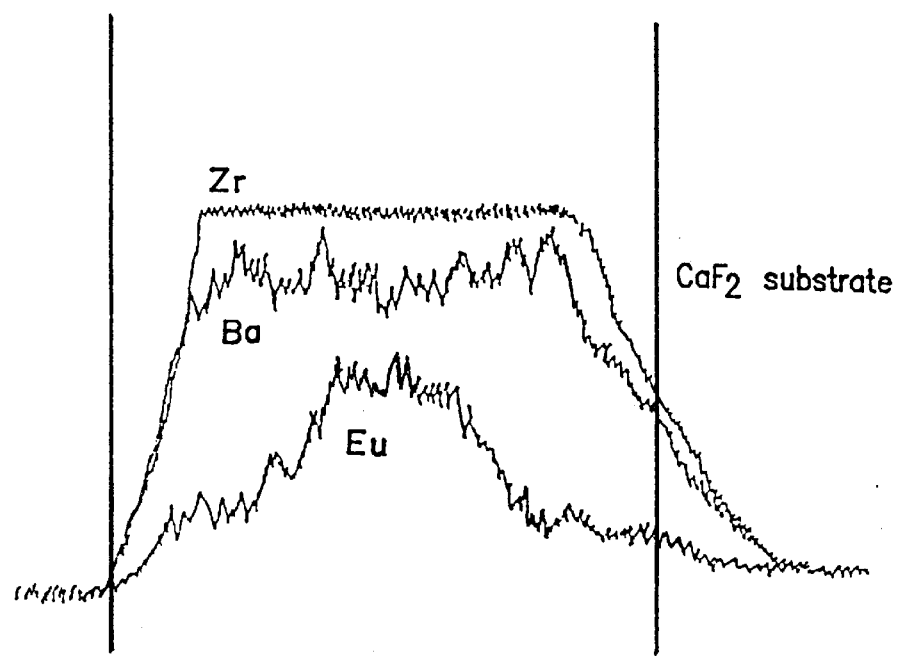
FIG. 6 shows curves exhibiting distribution of the concentrations of Zr, Ba, and Eu in the direction of the thickness of a thin film of a fluoride.

A colorless transparent thin film of a fluoride glass having the thickness of 5 μm was obtained. A fracture surface of the thin film was observed by using a scanning electron microscope, and the distribution of the concentrations of Zr, Ba, and Eu in the direction of the thickness were analyzed in spots of the diameter of 1 μm by the energy dispersive X-ray spectroscopy. FIG. 6 shows curves exhibiting the distribution of the concentrations of Zr, Ba, and Eu. The figure shows that europium alone is distributed in a high concentration at the central part as designed by the schedule of closing and opening of the valve. This shows that, by adjusting the flow rate of a gas of a volatile organometallic compound, the composition of the thin film of a fluoride can easily be controlled, and a thin film of a fluoride in which the composition varies stepwise or continuously in the direction of the thickness can be prepared.

Example 5

A colorless transparent thin film of a fluoride glass having the thickness of 3.6 μm was obtained in accordance with the same procedures as those conducted in Example 1 except that tris(1,1,1,2,2,3,3-heptafluoro-7,7-dimethyloctane-4,6-dionato)erbium Er(FOD)$_3$ was used as the volatile organometallic compound which is the starting material of metal for producing a thin film of a fluoride in place of tris (dipivaloylmethanato)europium Eu(DPM)$_3$, Er(FOD)$_3$ was vaporized by heating to 130° C., and delivery lines for gases of volatile organometallic compounds and a mixing vessel were all heated to 200° C.

Figure 7:
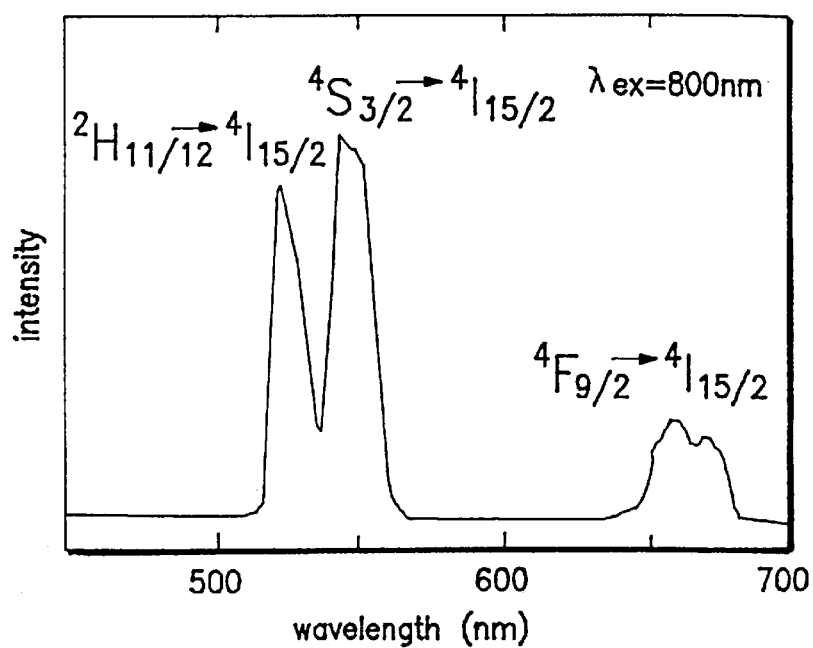
FIG. 7 shows an up-conversion fluorescence spectrum of a thin film of a fluoride excited by an infrared laser.

Erbium ion in the obtained thin film of a fluoride was activated by introducing infrared laser beams of 800 nm into the thin film by the prism coupling method using a rutile prism, and green fluorescence in accordance with the up-conversion principle was observed in the thin film of a fluoride glass. FIG. 7 shows the fluorescence spectrum of this thin film.

Example 6

A thin film of a fluoride was prepared in accordance with the same procedures as those conducted in Example 1 except that bis(1,1,1,5,5,6,6,7,7,7-decafluoroheptane-2,4-dionato) barium Ba(DFHD)$_2$ was used as the volatile organobarium compound and the temperature of heating of Ba(DFHD)$_2$ was adjusted to 190° C. A colorless transparent thin film of a fluoride glass was obtained. The distribution of the concentrations of Zr, Ba, and Eu in the direction of thickness was analyzed by the energy dispersive X-ray spectroscopy in accordance with the same method as that conducted in Example 4, and it was found that the concentration of Ba was gradually decreased from the surface of the substrate to the surface of the thin film of a fluoride glass. Ba(DFHD)$_2$ in the carburetor was degraded to form a dark brown very viscous liquid. The thin film of a fluoride glass in which the concentration of Ba was gradually decreased in the direction of the thickness of the thin film of a fluoride is considered to have been obtained because the amount of the gas of the volatile organobarium compound delivered to the reactor was gradually decreased by the degradation of Ba(DFHD)$_2$.

Example 7

A thin film of a fluoride was prepared by using nitrogen trifluoride NF$_3$ as the gaseous fluorinating agent and bis (pivaloylmethanato)barium triethylenetetramine adduct Ba(DPM)$_2$(Trien) alone as the volatile organometallic compound which is the starting material of metal for producing a thin film of a fluoride. Ba(DPM)$_2$(Trien) was vaporized by heating to 130° C. and delivered at the flow rate of 2.0 sccm by using argon as the carrier. A delivery line for the gas of the volatile organometallic compound and a mixing vessel were heated to 170° C. Nitrogen trifluoride NF$_3$ was delivered at the flow rate of a gas of 60 sccm, and a plasma of a gaseous fluorinating agent was generated under the electron cyclotron resonance condition of the microwave power of 30 W. The preparation of a thin film was conducted under the pressure of 1×10$^{-3}$ Torr, and a colorless transparent thin film of a fluoride having the thickness of 3.5 μm and an excellent mirror surface was obtained in 3 hours on a CaF$_2$ substrate heated to 300° C. The measurement of the obtained thin film of a fluoride was conducted by the thin film X-ray diffraction using the CuKα ray. Sharp peaks assigned to BaF$_2$ were found at 2θ=24.5° and 50.2°, and the thin film was found to have a high crystallinity.

Example 8

A thin film of a fluoride was prepared in accordance with the same procedures as those conducted in Example 1 except that the flow rate of the carrier gas used for bis (hexafluoroacetylacetonato)barium tetraglyme adduct Ba(HFA)$_2$(Tetraglyme) was adjusted to 1.5 sccm.

A colorless transparent thin film of a fluoride glass was obtained. The distribution of the concentrations of Zr, Ba, and Eu in the direction of thickness in the obtained thin film of a fluoride glass was analyzed by the energy dispersive X-ray spectroscopy in accordance with the same method as that conducted in Example 4, and it was found that the concentrations of all elements were uniformly distributed from the surface of the substrate to the surface of the thin film of a fluoride glass. Thus, it was shown that the composition of the thin film of a fluoride glass was uniform.

Figure 8:
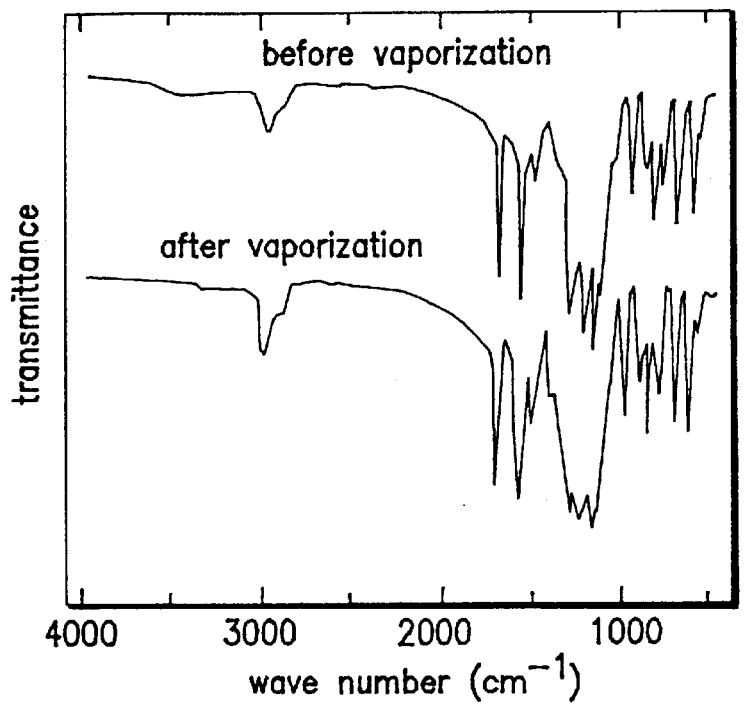
FIG. 8 shows infrared spectra of bis(hexafluoroacetylacetonato)barium tetraglyme adduct.

FIG. 8 shows the infrared absorption spectrum of Ba(HFA)$_2$(Tetraglyme) and the infrared absorption spectrum of a condensed material obtained after vaporizing Ba(HFA)$_2$(Tetraglyme) by heating to 170° C. in a vacuum. Both spectra are identical, and it is shown that Ba(HFA)$_2$ (Tetraglyme) is not degraded by the heating.

Example 9

A thin film of a fluoride glass was prepared in accordance with the same procedures as those conducted in Example 8 except that bis(dipivaloylmethanato)barium bis (orthophenanthroline) adduct Ba(DPM)$_2$(PHEN)$_2$ was used in place of bis(hexafluoroacetylacetonato)barium tetraglyme adduct Ba(HFA)$_2$(Tetraglyme) and vaporized by heating to 180° C. The vapor pressure of Ba(DPM)$_2$(PHEN)$_2$ at 180° C. was the same as the vapor pressure of Ba(HFA)$_2$ (Tetraglyme) used in Example 8 at 170° C.

The distribution of the concentrations of Zr, Ba, and Eu in the direction of thickness was analyzed by the energy dispersive X-ray spectroscopy in accordance with the same method as that conducted in Example 4, and it was found that the concentration of Ba was gradually decreased from the surface of the substrate to the surface of the thin film of a fluoride glass. Ba(DPM)$_2$(PHEN)$_2$ in the carburetor was degraded into a yellow brown solid. The thin film of a fluoride glass in which the concentration of Ba was gradually decreased in the direction of the thickness of the thin film of a fluoride is considered to have been obtained because the amount of the gas of the volatile organobarium compound delivered to the reactor was gradually decreased by the degradation of Ba(DPM)$_2$(PHEN)$_2$.

Figure 9:
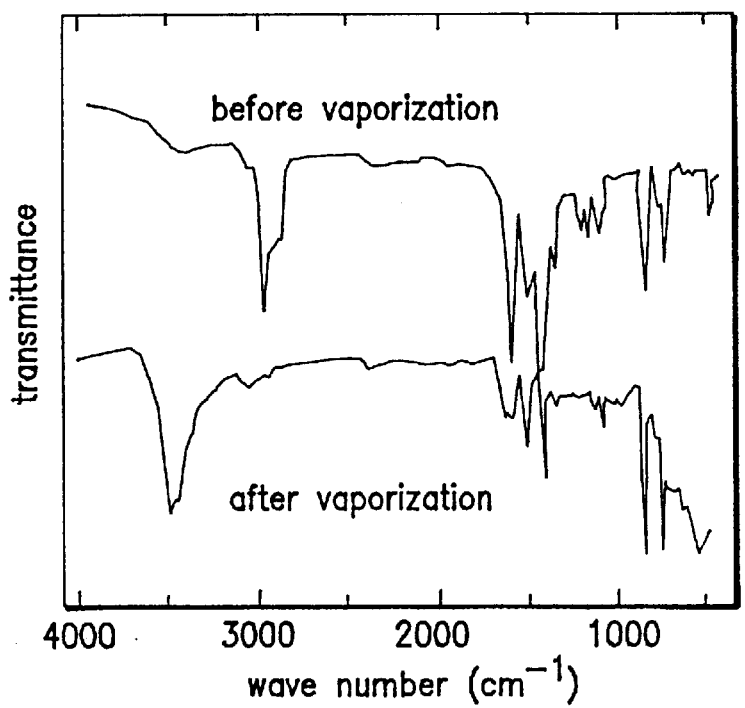
FIG. 9 shows infrared spectra of bis(dipivaloylmethanato) barium bis(orthophenanthroline) adduct.

FIG. 9 shows the infrared absorption spectrum of Ba(DPM)$_2$(PHEN)$_2$ and the infrared absorption spectrum of the condensed material after vaporizing Ba(DPM)$_2$(PHEN)$_2$ by heating at 180° C. in a vacuum. The infrared absorption spectrum of the condensed material obtained after vaporization by heating shows a large change from the infrared absorption spectrum of Ba(DPM)$_2$(PHEN)$_2$ before the heating, and it is shown that Ba(DPM)$_2$(PHEN)$_2$ is degraded by the heating.

The results of Examples 8 and 9 show that bis (hexafluoroacetylacetonato)barium tetraglyme adduct Ba(HFA)$_2$(Tetraglyme) in which tetraglyme having 5 oxygen atoms which can coordinate to one barium ion is coordinated is stable under heating, and a thin film of a fluoride having a uniform composition can be obtained. In contrast, bis(dipivaloylmethanato)barium bis (orthophenanthroline) adduct Ba(DPM)$_2$(PHEN)$_2$ in which phenanthroline having 2 nitrogen atoms which can coordinate to one barium ion is coordinated is degraded by heating, and a thin film of a fluoride having the decreasing concentration of Ba was obtained.

The structural formulae of the ligands and the organic molecules having 3 or more heteroatoms which can coordinate to one barium ion used in the examples are shown in Table 1.

TABLE 1

| compound | structural formula |
|---|---|
| HFA | $CF_3-CO-CH_2-CO-CF_3$ |
| DPM | $(CH_3)_3C-CO-CH_2-CO-C(CH_3)_3$ |
| Triglyme | $CH_3-(O-CH_2-CH_2)_3-O-CH_3$ |
| Tetraglyme | $CH_3-(O-CH_2-CH_2)_4-O-CH_3$ |
| Trien | $NH_2-(CH_2-CH_2-NH)_2-CH_2-CH_2-NH_2$ |
| Tetraen | $NH_2-(CH_2-CH_2-NH)_3-CH_2-CH_2-NH_2$ |
| DFHD | $CF_3-CO-CH_2-CO-CF_2-CF_2-CF_3$ |
| FOD | $(CH_3)_3C-CO-CH_2-CO-CF_2-CF_2-CF_3$ |
| PHEN | 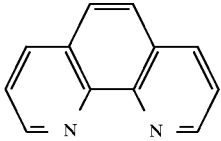 |

What is claimed is:

1. A process for producing a thin film of a fluoride comprising reacting a gaseous fluorinating agent and gas of a volatile organometallic compound in a gas phase in a reactor, wherein a plasma of the gaseous fluorinating agent obtained by activating the gaseous fluorinating agent by microwave under a condition of electron cyclotron resonance is used as a fluorine source, and the fluoride is deposited on a substrate by reacting the plasma of the gaseous fluorinating agent with the gas of a volatile organometallic compound at outside of an area of generation of the plasma.

2. A process according to claim 1, wherein pressure in the reactor is $10^{-2}$ Torr or lower.

3. A process according to claim 1, wherein a volatile organobarium compound in which at least one organic molecule having 3 to 12 heteroatoms coordinated to one barium ion is used as said volatile organometallic compound so that a composition of the thin film of a fluoride comprises barium.

4. A process according to claim 3, wherein temperature of the substrate is kept higher than or equal to a boiling point of the organic molecule coordinated to barium ion.

5. A process according to claim 3, wherein the heteroatom is at least one atom selected from the group consisting of oxygen, nitrogen, and sulfur.

6. A process according to claim 1, wherein the produced fluoride is a fluoride glass and temperature of the substrate is kept lower than crystallization temperature of the fluoride glass.

7. A process according to claim 1, wherein a composition distribution is formed in a direction of thickness in the thin film of a fluoride by separately adjusting flow rate of said gas of a volatile organometallic compound.

* * * * *